United States Patent
Bai

(10) Patent No.: US 10,295,868 B2
(45) Date of Patent: May 21, 2019

(54) DISPLAY SUBSTRATE, METHOD FOR MANUFACTURING THE SAME, DISPLAY PANEL, AND METHOD FOR MANUFACTURING THE SAME

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventor: Xuefei Bai, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 286 days.

(21) Appl. No.: 15/145,243

(22) Filed: May 3, 2016

(65) Prior Publication Data
US 2017/0038620 A1    Feb. 9, 2017

(30) Foreign Application Priority Data

Aug. 3, 2015    (CN) .......................... 2015 1 0483076

(51) Int. Cl.
*G02F 1/1339*    (2006.01)
*H01L 51/52*    (2006.01)

(52) U.S. Cl.
CPC ........ *G02F 1/1339* (2013.01); *H01L 51/5246* (2013.01)

(58) Field of Classification Search
CPC .................................................... G02F 1/1339
See application file for complete search history.

(56) References Cited

U.S. PATENT DOCUMENTS

| | | | |
|---|---|---|---|
| 2007/0153224 A1* | 7/2007 | Jung | ...................... G02F 1/1339 349/189 |
| 2008/0088752 A1 | 4/2008 | Kim et al. | |
| 2011/0069271 A1* | 3/2011 | Chu | ....................... G02F 1/1339 349/153 |

FOREIGN PATENT DOCUMENTS

| | | |
|---|---|---|
| CN | 2632849 Y | 8/2004 |
| CN | 16332547 A | 6/2005 |
| CN | 101551556 A | 10/2009 |
| CN | 103102075 A | 5/2013 |

OTHER PUBLICATIONS

The First Chinese Office Action dated Aug. 14, 2017; Appln. 201510483076.9.
The Third Chinese Office Action dated Sep. 21, 2018; Appln. No. 201510483076.9.

* cited by examiner

*Primary Examiner* — Jeffry H Aftergut
(74) *Attorney, Agent, or Firm* — Ladas & Parry LLP

(57) ABSTRACT

A display substrate, a method for manufacturing thereof, a display panel and a method for manufacturing thereof are disclosed. The display substrate includes a display region and a sealing region surrounding the display region. A plurality of through holes are formed within the sealing region of the display substrate.

5 Claims, 3 Drawing Sheets

DISPLAY SUBSTRATE, METHOD FOR MANUFACTURING THE SAME, DISPLAY PANEL, AND METHOD FOR MANUFACTURING THE SAME

TECHNICAL FIELD

Embodiments of the present disclosure relates to a display substrate, a method for manufacturing the same, a display panel, and a method for manufacturing the same.

BACKGROUND

A display panel generally comprises a back plate and a cover plate, which are assembled together by a sealant. Before the assembling process, the sealant is applied onto four edges of the cover plate and cured. During the assembling process, the cured sealant is melted by laser irradiating, and then the melted sealant spreads to the surface of the back plate, such that the back plate and the cover plate are adhered to each other.

The adhesion strength between the cover plate and the back plate is decreased, because of the uneven surface of the cured sealant before laser irradiating.

SUMMARY

In first aspect of the present disclosure, there is provided a display substrate, which comprises a display region and a sealing region surrounding the display region, wherein a plurality of through holes are formed within the sealing region of the display substrate.

In second aspect of the present disclosure, there is provided a method for manufacturing a display substrate, which comprises: providing a base substrate, the base substrate comprising a first portion corresponding to a display region of the display substrate and a second portion corresponding to a sealing region of the display substrate; forming a plurality of through holes within the second portion of the base substrate.

In third aspect of the present disclosure, there is provided a method for manufacturing a display panel, which comprises: providing a sealant within a sealing region of a cover plate and curing the sealant; assembling the cover plate and the display substrate of claim 1 to make the sealant on the cover plate overlap the plurality of through holes within the sealing region of display substrate; heating both of the sealing regions to melt the sealant at a first temperature, and the melted sealant is filled into the plurality of through holes.

In fourth aspect of the present disclosure, there is provided a display panel, which comprises the above display substrate

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
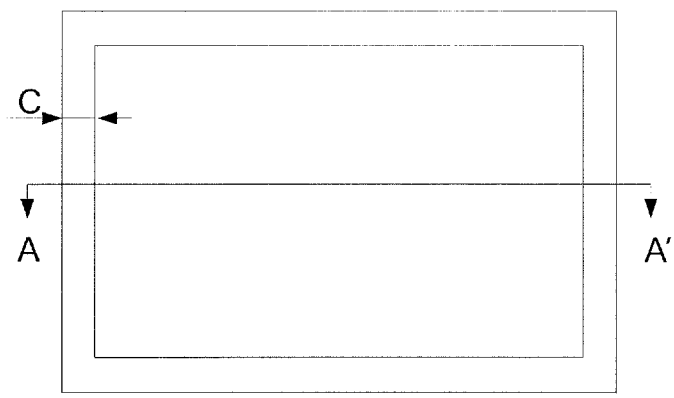
FIG. 1 is a structural schematic view illustrating a display panel.

As illustrated in FIG. 1, a display panel, which is formed by a back plate 12 and a cover plate 11 assembled together, comprises a display region and a sealing region C. A sealant 13 is filled within the sealing region C to provide adhesion between the back plate 12 and the cover plate 11.

Figure 2A:
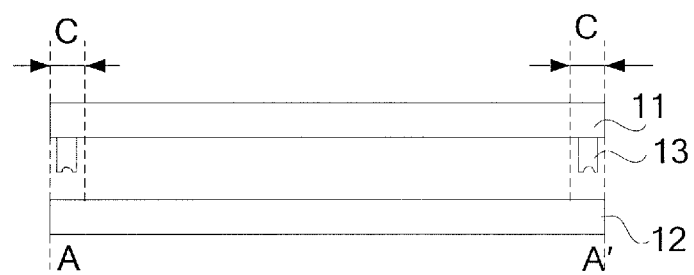
FIG. 2(*a*) and FIG. 2(*b*) are sectional views illustrating the display panel in FIG. 1.
Figure 2B:
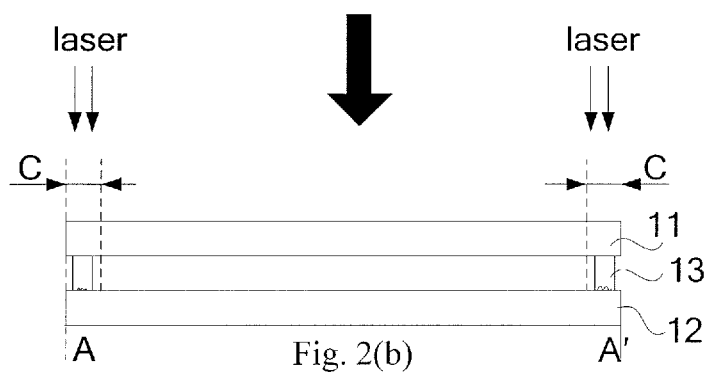

Firstly, as illustrated in FIG. 2(*a*), before the assembling process, the sealant 13 is applied onto the sealing region C of the cover plate 11 and cured. Then, the cover plate 11 is assembled with the back plate to form a cell. Next, as illustrated in FIG. 2(*a*), the sealant 13, which melted by a laser irradiation, spreads to the surface of the back plate 12 and then cured. Because the surface morphology is rugged, gases generated during laser irradiation accumulates in the sealant 13, accordingly, the adhesion strength between the sealant 13 and the back plate 12 is decreased.

To make the objects, the technical solutions and the advantages of the embodiments of the present disclosure more apparent, the embodiments of the present disclosure will be described clearly and completely hereinafter in conjunction with the drawings. Obviously, the followings are merely a part of, rather all of, the embodiments of the present disclosure. Based on the following embodiments, all the other embodiments obtained by a person skilled in the art without any creative effort also fall in the scope of the present disclosure.

Figure 3:
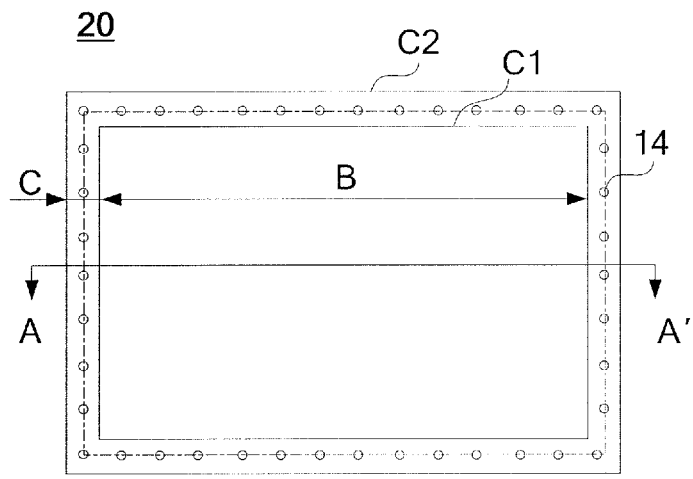
FIG. 3 is a structural schematic view illustrating a display substrate according to an embodiment of the present disclosure.
Figure 4:
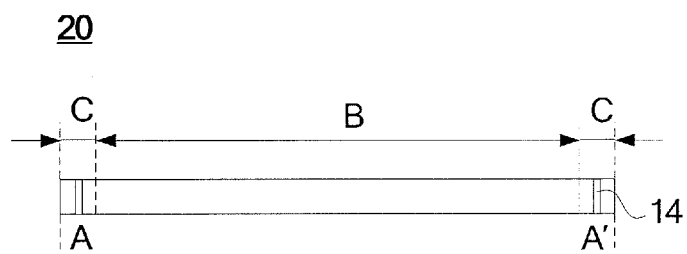
FIG. 4 is a sectional view of the display panel in FIG. 3 along A-A' direction.

As illustrated in FIG. 3 and FIG. 4, an embodiment of the present disclosure provides a display substrate. The display substrate comprises a display region B and a sealing region C surrounding the display region B. A plurality of through holes are formed in the sealing region C, wherein "a plurality of" refers to two or more.

According to the display substrate provided by the embodiment of the present disclosure, the adhesive interface quality and the sealing effect between the sealant and display substrate are increased due to the through holes in sealing region, by which the gases in the sealant can be exhausted.

It should be noted that depending on types of the display device to be formed in the display region, the display panel may be an array substrate or a color filter substrate of a TFT-LCD (Thin Film Transistor-Liquid Crystal Display), and also may be an array substrate or a sealing substrate of an OLED (Organic Light Emitting Display).

As illustrated in FIG. 3, in at least some embodiments of the present disclosure, a plurality of through holes 14 are evenly distributed at equal intervals so as to ensure a uniform sealing strength of the sealing region of the display substrate. The shape of the through holes could be arbitrarily, such as round, square, and so on, or may be of irregular shape. The embodiments of the present disclosure will be described by taking an example of the through holes in round shape.

In at least some embodiments of the present disclosure, the sealing region is defined by an inner boundary and an outer boundary. The through holes are located at the center between the inner boundary and the outer boundary. As illustrated in FIG. 3, the plurality of through holes 14 are disposed along the center line (illustrated as dotted line) between the inner boundary C1 and the outer boundary C2 to ensure that the sealant overlaps the through holes during the assembling process.

For example, the shape of the through holes is round, and the diameter of the holes is not more than 300 μm. The diameter of the through holes could be adjusted depending on the dimension of the display substrate.

In at least some embodiments of the present disclosure, at least some through holes are filled with a filler. Firstly, it can increase the supporting strength of the display substrate. Secondly, it can avoid the failure to fill the sealant into the through holes caused by plugging the through holes with other materials when forming the other display devices within the display region. After forming the through holes, the filler, for example with a low melting point, is filled into the through holes; therefore, the melted filler can flow out from the through holes easily while heating the sealing region. In other embodiments, all the through holes are filled with the filler.

Another embodiment of the present disclosure provides a method for manufacturing the display substrate, comprises:

Step 101: providing a base substrate which comprises a first portion corresponding to a display region of the display substrate and a second portion corresponding to a sealing region of the display substrate;

Step 102: forming a plurality of through holes in the second portion of the base substrate.

For example, the through holes are formed by a laser ablation or mechanical drilling process. However, the embodiments of the present disclosure are not particularly limited thereto.

In at least some embodiments of the present disclosure, after forming a plurality of the through holes in the second portion of the base substrate, the method further comprises: filling the fillers into at least some the through holes. The fillers can be chosen from different materials, depending on the different function of the fillers in the through holes. The embodiment of the present disclosure will describe an example of the fillers with the melting point lower than the melting point of the sealant for illustrative purposes.

Figure 6:
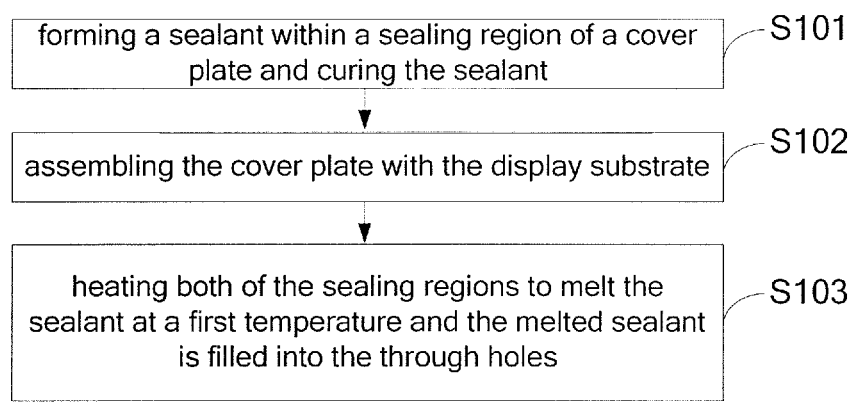
FIG. 6 is a flow chart illustrating a method for manufacturing a display panel according an embodiment of the present disclosure.

As illustrated in FIG. 6, another embodiment of the present disclosure provides a method for manufacturing the display panel comprises:

Step 101: forming a sealant within a sealing region of a cover plate and curing the sealant;

Step 102: assembling the cover plate with the display substrate provided by the embodiment of the present disclosure. For example, referring to FIG. 5, the sealing region C of the cover plate 11 is disposed opposite to the sealing region C of the display substrate. The sealant 13 of the cover plate 11 overlaps the through holes 14 of the sealing region C of the display substrate 20.

Step 103: heating both of the sealing regions to melt the sealant at a first temperature and the melted sealant is filled into the through holes.

In at least some embodiment of the present disclosure, some of through holes within the sealing region are filled with the filler, and the melting point of the filler is lower than the melting point of the sealant. For example, the sealant is a mixture of frit powder and an adhesion agent mixed in a certain ratio. As an example, the frit powder is formed by mixing glass powder and inorganic powder (such as $SiO_2$, $B_2O_3$, $P_2O_5$, $V_2O_3$, $GeO_2$); and the adhesion agent is formed by mixing organic adhesion agent (such as ethyl cellulose or nitrocellulose) and organic solvent (such as alcohol, benzene or ketone). For example, the melting point of the sealant is approximately 400° C., and the filler is a hot-melt adhesive with low melting point (100° C.<T<250° C.), such as hot-melt adhesive, resin or rubber. When the sealing region is heated, the filler is melted prior to the sealant and flows out from the through holes, because the melting point of the filler is lower than the melting point of the sealant. The gas in the sealant can be exhausted through the through holes. Finally, the sealant is filled into the through holes. Apparently, the materials of the sealant and the filler are not limited to above; the present disclosure is described by taking the above example for illustrative purpose.

During the formation of the other display devices within the display region of the display substrate, the through holes may possibly be plugged with the material used for forming the display devices. Therefore, after forming the through holes, the material with the melting point lower than the melting point of the sealant is filled into the through holes so as to avoid plugging the through holes. In this way, during the assembling process, the filler can be melted and flow out from the through holes prior to the sealant, such that the gas in the sealant can be exhausted through the through holes.

In at least some embodiments of the present disclosure, before the step 102, the method further comprises: providing the display substrate above a platform and suspending the sealing region of the display substrate above the platform.

In at least some embodiments of the present disclosure, the step 102 comprises: attaching the cover plate to the display substrate on the platform.

The sealing region of the display substrate is suspended on the platform so that the filler or the sealant is easily to flow out through the through holes.

The embodiment is described by making the sealing region suspended for illustrative purpose, in other embodiments, the exhaustion of gas also may be implemented in various different ways.

Figure 5:
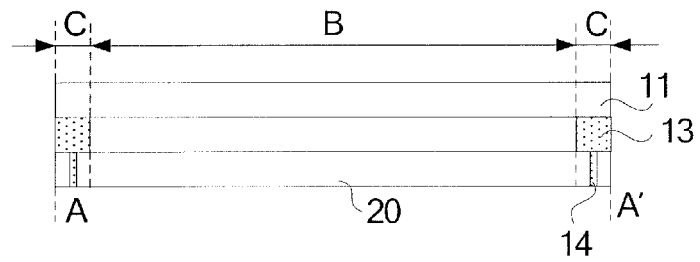
FIG. 5 is a structural schematic view illustrating a display panel according to an embodiment of the present disclosure.

As illustrated in FIG. 5, another embodiment of the present disclosure provides a display panel comprising any one of the display substrate 20 provided by the embodiments of the present disclosure and the cover plate 11. As an example, the sealant 13 is disposed within the sealing regions of the display substrate 20 and of the cover plate 11; the sealant 13 is filled into the through holes 14 within the sealing region C of the display substrate 20.

The embodiments of the present disclosure provide a display substrate and the method for manufacturing thereof, display panel and the method for manufacturing thereof. During sealing process, the gas in the sealant can be exhausted by the through holes, which are formed within the sealing region of the display substrate, so as to increase the adhesive interface quality and the sealing effect.

What is described above is related to the illustrative embodiments of the disclosure only and not limitative to the scope of the disclosure; the scopes of the disclosure are defined by the accompanying claims.

The present application claims the priority of Chinese patent application No. 201510483076.9 filed on Aug. 3, 2015, the disclosure of which is incorporated herein by reference in its entirety.

The invention claimed is:

1. A method for manufacturing a display panel, comprising:
   providing a sealant within a sealing region of a cover plate and curing the sealant;
   assembling the cover plate and a display substrate, the display substrate comprising a display region and a sealing region surrounding the display region wherein a plurality of through holes being formed within the sealing region of the display substrate, to make the sealant on the cover plate overlap the plurality of through holes within the sealing region of display substrate;

heating both of the sealing regions to melt the sealant at a first temperature, and the melted sealant is filled into the plurality of through holes.

2. The method of claim 1, wherein at least a part of the plurality of through holes are filled with a filler, and a melting point of the filler is lower than that of the sealant.

3. The method of claim 2, wherein the step of heating both of the sealing regions further comprises: melting the filler to make the filler flow out from the at least a part of the plurality of through holes.

4. The method of claim 1, wherein before assembling the cover plate and the display substrate, the method further comprises: providing the display substrate above a platform and suspending the sealing region of display substrate above the platform.

5. The method of claim 4, wherein the step of assembling the cover plate and the display substrate comprises: attaching the cover substrate to the display substrate on the platform.

* * * * *